United States Patent
Han et al.

(10) Patent No.: US 10,630,258 B2
(45) Date of Patent: Apr. 21, 2020

(54) ACOUSTIC WAVE RESONATOR AND FILTER INCLUDING THE SAME

(71) Applicant: Samsung Electro-Mechanics Co., Ltd., Suwon-si (KR)

(72) Inventors: Sung Han, Suwon-si (KR); Tae Kyung Lee, Suwon-si (KR); Sung Sun Kim, Suwon-si (KR); Won Han, Suwon-si (KR); Hwa Sun Lee, Suwon-si (KR); Seung Joo Shin, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 585 days.

(21) Appl. No.: 15/459,756

(22) Filed: Mar. 15, 2017

(65) Prior Publication Data

US 2018/0083597 A1 Mar. 22, 2018

(30) Foreign Application Priority Data

Sep. 21, 2016 (KR) .......................... 10-2016-0120664

(51) Int. Cl.
*H01L 41/09* (2006.01)
*H03H 9/02* (2006.01)
*H03H 9/17* (2006.01)
*H03H 9/54* (2006.01)

(52) U.S. Cl.
CPC .......... *H03H 9/17* (2013.01); *H03H 9/02118* (2013.01); *H03H 9/02157* (2013.01); *H03H 9/173* (2013.01); *H03H 9/547* (2013.01)

(58) Field of Classification Search
CPC .. H03H 9/17; H03H 9/02118; H03H 9/02157; H03H 9/173; H03H 9/547

USPC ................................................. 310/365, 367
See application file for complete search history.

(56) References Cited

U.S. PATENT DOCUMENTS

| | | | |
|---|---|---|---|
| 9,444,429 B2* | 9/2016 | Sakashita | H03H 3/02 |
| 2003/0071539 A1 | 4/2003 | Kuratani et al. | |
| 2008/0061907 A1 | 3/2008 | Lee et al. | |
| 2008/0143215 A1* | 6/2008 | Hara | H03H 3/04 310/328 |
| 2009/0033177 A1* | 2/2009 | Itaya | H03H 3/02 310/335 |
| 2016/0163954 A1 | 6/2016 | Shin et al. | |
| 2018/0323767 A1* | 11/2018 | Then | H03H 3/02 |

FOREIGN PATENT DOCUMENTS

| | | |
|---|---|---|
| KR | 2002-0084332 A | 11/2002 |
| KR | 10-0802109 B1 | 2/2008 |
| KR | 10-2010-0077346 A | 7/2010 |
| KR | 10-2016-0069263 A | 6/2016 |

OTHER PUBLICATIONS

Korean Office Action dated Sep. 19, 2017, in corresponding Korean Application No. 10-2016-0120664 (6 pages in English, 5 pages in Korean).

* cited by examiner

*Primary Examiner* — Thomas M Dougherty
(74) *Attorney, Agent, or Firm* — NSIP Law

(57) ABSTRACT

An acoustic wave resonator includes: a first piezoelectric portion of a piezoelectric layer, disposed on a cavity and having a first average thickness; and a second piezoelectric portion of the piezoelectric layer, disposed adjacent to an edge of the first piezoelectric portion and having a second average thickness that is different from the first average thickness.

20 Claims, 7 Drawing Sheets

A

ACOUSTIC WAVE RESONATOR AND FILTER INCLUDING THE SAME

CROSS-REFERENCE TO RELATED APPLICATIONS

This application claims the benefit under 35 U.S.C. § 119(a) of Korean Patent Application No. 10-2016-0120664 filed on Sep. 21, 2016 in the Korean Intellectual Property Office, the entire disclosure of which is incorporated herein by reference for all purposes.

BACKGROUND

1. Field

The following description relates to an acoustic wave resonator and a filter including the acoustic wave resonator.

2. Description of Related Art

An acoustic wave resonator is an apparatus in which energy resonates at a specific frequency. Such an acoustic wave resonator is used, for example, in a filter, an oscillator, and a frequency counter. An example of an acoustic wave resonator is an apparatus using acoustic waves in a thickness direction. Such an acoustic wave resonator is widely used to filter a frequency from a high frequency band.

The acoustic wave resonator described above primarily generates acoustic waves in a thickness direction, but also inevitably generates resonance in a horizontal direction perpendicular to the thickness direction. However, the resonance generated in the horizontal direction may cause noise of the acoustic wave resonator. Therefore, the development of an acoustic wave resonator capable of minimizing or preventing the generation of resonance in the horizontal direction is desired.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave resonator includes: a first piezoelectric portion of a piezoelectric layer, disposed on a cavity and having a first average thickness; and a second piezoelectric portion of the piezoelectric layer, disposed adjacent to an edge of the first piezoelectric portion and having a second average thickness that is different from the first average thickness.

The first average thickness may be greater than the second average thickness.

A minimum thickness of the first piezoelectric portion may be greater than a minimum thickness of the second piezoelectric portion.

A minimum thickness of the first piezoelectric portion may be less than a minimum thickness of the second piezoelectric portion.

A maximum thickness of the first piezoelectric portion may be less than a maximum thickness of the second piezoelectric portion.

A maximum thickness deviation of the second piezoelectric portion may be smaller than a width of the second piezoelectric portion.

The acoustic wave resonator may further include electrode layers formed above and below the first piezoelectric portion and the second piezoelectric portion.

The acoustic wave resonator may further include a third piezoelectric portion disposed at an edge of the second piezoelectric portion.

A width of the third piezoelectric portion may be equal to or less than a width of the second piezoelectric portion.

The third piezoelectric portion may have a third average thickness that is greater than the first average thickness and the second average thickness The first piezoelectric portion may have a first surface roughness, and the second piezoelectric portion may have a second surface roughness that is different from the first surface roughness.

A filter may include the acoustic wave resonator.

In another general aspect, an acoustic wave resonator includes: a first piezoelectric portion of a piezoelectric layer, having a first maximum thickness deviation; and a second piezoelectric portion of the piezoelectric layer, disposed at an edge of the first piezoelectric portion and having a second maximum thickness deviation that is different than the first maximum thickness deviation.

The second maximum thickness deviation may be greater than the first maximum thickness deviation.

An average thickness of the first piezoelectric portion may be different from an average thickness of the second piezoelectric portion.

A maximum thickness of the first piezoelectric portion may be less than or equal to a maximum thickness of the second piezoelectric portion.

The acoustic wave resonator may further include: a first electrode layer disposed on a first surface of the first piezoelectric portion; and a second electrode layer disposed on a second surface of the first piezoelectric portion.

The acoustic wave resonator may further include a cavity disposed between the first piezoelectric portion and a substrate.

The first maximum thickness deviation may be formed by a roughness of a surface of the first piezoelectric portion, and the second maximum thickness deviation may be formed by a roughness of a surface of the second piezoelectric portion.

A ratio of the second maximum thickness deviation to a width of the second piezoelectric portion may be in a range of 6 to 10.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
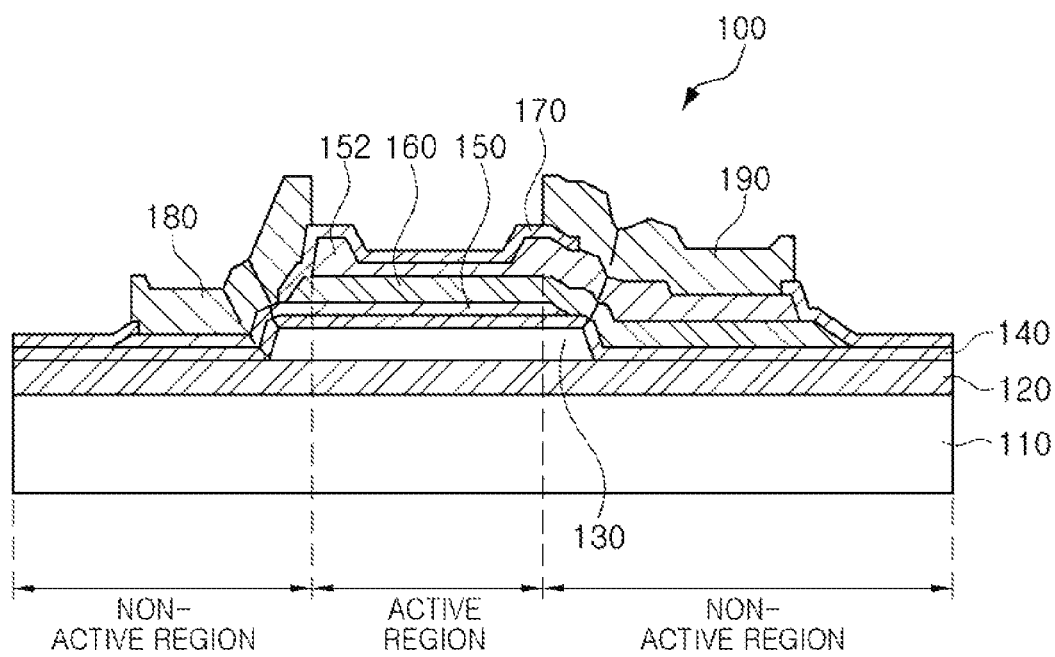
FIG. 1 is a cross-sectional view of an acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates an acoustic wave resonator 100, according to an embodiment. Referring to FIG. 1, the acoustic wave resonator 100 includes a substrate 110, a cavity 130, first and second electrode layers 150 and 152, and a piezoelectric layer 160.

The substrate 110 is configured to support the cavity 130, the electrode layers 150 and 152, and the piezoelectric layer 160. For example, the substrate 110 is sized and shaped such that the cavity 130, the first and second electrode layers 150 and 152, and the piezoelectric layer 160 are integrally disposed thereon. Further, the substrate 110 has strength capable of integrally supporting the cavity 130, the first and second electrode layers 150 and 152, and the piezoelectric layer 160. According to an embodiment, the substrate 110 is a silicon substrate or a silicon-on-insulator (SOI) substrate.

The substrate 110 is configured to maintain a predetermined shape. For example, the substrate 110 is configured so as not to be deformed by an etching process. To this end, an insulating layer 120 is formed on one surface of the substrate 110. The insulating layer 120 may serve to protect the substrate 110 in an operation of forming the cavity 130. The insulating layer 120 may be formed on the substrate 110 by performing a chemical vapor deposition process, an RF magnetron sputtering process, or an evaporation process for any one or any combination of any two or more of silicon dioxide ($SiO_2$), silicon nitride ($Si_3N_4$), aluminum oxide ($Al_2O_3$), and aluminum nitride (AlN). However, a material of the insulating layer 120 is not limited to the above-mentioned materials.

The cavity 130 is formed on or in the substrate 110. For example, the cavity 130 is one or more empty spaces surrounded by one or more layers on one surface of the substrate 110. According to the illustrated embodiment, the cavity 130 is formed between the insulating layer 120 and a membrane layer 140 disposed on the insulating layer 120.

The cavity 130 formed as described above enables the piezoelectric layer 160 to resonate at a specific frequency.

The cavity 130 may be formed by an etching process including forming a sacrificial layer pattern for the cavity 130 on the insulating layer 120, forming the membrane layer 140 on the sacrificial layer pattern, and then etching and removing the sacrificial layer pattern. In this case, the membrane layer 140 serves as an oxide protective film, or a protective layer protecting the substrate 110. Although not illustrated in FIG. 1, a seed layer formed of aluminum nitride (AlN), or a dielectric or a metal having an HCP structure may be formed on the membrane layer 140. For example, in a case in which the seed layer is formed of a metal, the metal may be titanium (Ti) or a titanium (Ti) alloy. Specifically, the seed layer may be disposed between the membrane layer 140 and the first electrode layer 150.

The first and second electrode layers 150 and 152 are disposed on the piezoelectric layer 160. For example, the first electrode layer 150 is disposed below the piezoelectric layer 160, and the second electrode layer 152 is disposed above the piezoelectric layer 160. The first and second electrode layers 150 and 152 may be disposed so as not to be in contact with each other. For example, the first electrode layer 150 is extended on a bottom of the piezoelectric layer 160 from one side (e.g., the left side in FIG. 1) of the substrate 110, and the second electrode layer 152 is extended on a top of the piezoelectric layer 160 from the other side (e.g., the right side in FIG. 1) of the substrate 110. In accordance with the above-mentioned arrangement, the substrate 110, the insulating layer 120, the cavity 130, the membrane layer 140, the first electrode layer 150, the piezoelectric layer 160, and the second electrode layer 152 are sequentially disposed in the central portion of the acoustic wave resonator 100.

The first and second electrode layers 150 and 152 are formed of a conductive material. For example, the electrode layers 150 and 152 are formed of a metal such as gold (Au), molybdenum (Mo), ruthenium (Ru), aluminum (Al), platinum (Pt), titanium (Ti), tungsten (W), palladium (Pd), chromium (Cr), nickel (Ni), tantalum (Ta), or iridium (Ir), or an alloy of any such metals. The first and second electrode layers 150 and 152 disposed as described above may resonate the piezoelectric layer 160 in response to an external signal to generate a set resonance frequency and an antiresonance frequency.

The first and second electrode layers 150 and 152 may further include first and second connection electrode layers 180 and 190, respectively. The first and second connection electrode layers 180 and 190 may be disposed in a substantially symmetrical form on the first and second electrode layers 150 and 152, respectively, about the piezoelectric layer 160. For example, the first connection electrode layer 180 is formed from one end of the first electrode layer 150 to one end of the piezoelectric layer 160, and the second connection electrode layer 190 is formed from one end of the second electrode layer 152 to the other end of the piezoelectric layer 160.

The first and second connection electrode layers 180 and 190 formed as described above may be used to confirm filter characteristics of the acoustic wave resonator 100 and performing a necessary frequency trimming of the acoustic wave resonator 100.

The piezoelectric layer 160 is configured to be mechanically vibrated. For example, the piezoelectric layer 160 is disposed between the first electrode layer 150 and the second electrode layer 152 to be vibrated in response to signals transferred from the first and second electrode layers 150 and 152. The piezoelectric layer 160 is vibrated in a thickness direction thereof. For example, the piezoelectric layer 160 is disposed above the cavity 130 to vibrate air in the cavity 130 in a vertical direction (i.e., the thickness direction of the piezoelectric layer 160).

For example, piezoelectric layer 160 may be formed of aluminum nitride (AlN), zinc oxide (ZnO), or lead zirconium titanium oxide (PZT; PbZrTiO). For example, the piezoelectric layer 160 may be formed of aluminum nitride (AlN). In a case in which the piezoelectric layer 160 is formed of AlN, the piezoelectric layer 160 may further include a rare earth metal. The rare earth metal may include any one or any combination of any two or more of scandium (Sc), erbium (Er), yttrium (Y), and lanthanum (La).

The piezoelectric layer 160 is disposed on a substantially flat portion. For example, the piezoelectric layer 160 is formed on a flat portion of the first electrode layer 150 and is not formed on an inclined portion of the first electrode layer 150. The piezoelectric layer 160 disposed as described above may be easily deposited on the first electrode layer 150 and may have excellent adhesion with the first electrode layer 150.

The resonating part of the acoustic wave resonator 100 is partitioned into an active region and a non-active region, as illustrated in FIG. 1. The active region of the resonating part refers to a region in which all of the first electrode layer 150, the piezoelectric layer 160, and the second electrode layer 152 are sequentially stacked in the vertical direction. A piezoelectric phenomenon vibrates the active region of the resonating part in a predetermined direction to perform the resonance. For example, when electrical energy such as a radio signal is applied to the first electrode layer 150 and the second electrode layer 152 to induce an electric field in the piezoelectric layer 160, the active region of the resonating part is vibrated in the predetermined direction by the piezoelectric phenomenon. The non-active region of the resonating part refers to a region in which only some of the first electrode layer 150, the piezoelectric layer 160, and the second electrode layer 152 are sequentially stacked in the vertical direction, and refers to a region that does not substantially resonate by the piezoelectric phenomenon of the piezoelectric layer 160. The non-active region of the resonating part may be disposed at an edge of the active region.

The acoustic wave resonator 100 having the configuration as described above may filter a radio signal of a specific frequency using a piezoelectric effect of the piezoelectric layer 160. For example, the acoustic wave resonator 100 resonates the piezoelectric layer 160 in response to the RF signals applied to the first electrode layer 150 and the second electrode layer 152 to generate an acoustic wave having a specific resonance frequency and antiresonance frequency.

A resonance phenomenon of the piezoelectric layer 160 may occur when a half of a wavelength of the applied RF signal matches a thickness of the piezoelectric layer 160. When the resonance phenomenon occurs, electrical impedance rapidly changes. The acoustic wave resonator 100 may be used as a filter for selecting a specific frequency using the above-mentioned phenomenon. Additionally, since the acoustic wave resonator 100 has a predetermined resonance frequency according to the vibration occurring in the piezoelectric layer 160, the acoustic wave resonator 100 may output only a signal that matches the resonance frequency of the resonating part, among the input RF signals.

The resonance frequency is determined by the thickness of the piezoelectric layer 160, the first and second electrode layers 150 and 152 that surround the piezoelectric layer 160, inherent acoustic wave velocity of the piezoelectric layer 160, and the materials and configuration of the various components of the acoustic wave resonator 100. For reference, as the thickness of the piezoelectric layer 160 is decreased, the resonance frequency may increase.

The acoustic wave resonator 100 may further include a component that protects the first and second electrode layers 150 and 152 and the piezoelectric layer 160. For example, the acoustic wave resonator 100 further includes a protective layer 170. The protective layer 170 is formed on the second electrode layer 152 and the piezoelectric layer 160 to prevent the second electrode layer 152 and the piezoelectric layer 160 from being exposed to an external environment and being oxidized.

A configuration of the piezoelectric layer 160 will be described in detail below with reference to FIGS. 2 and 3.

Figure 2:
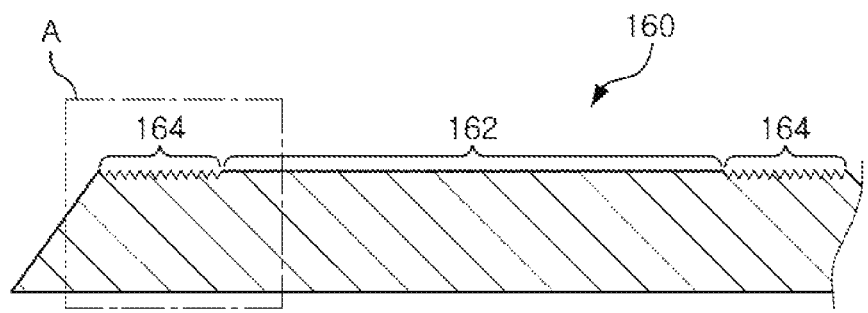
FIG. 2 is an enlarged view of a piezoelectric layer illustrated in FIG. 1.
Figure 3:
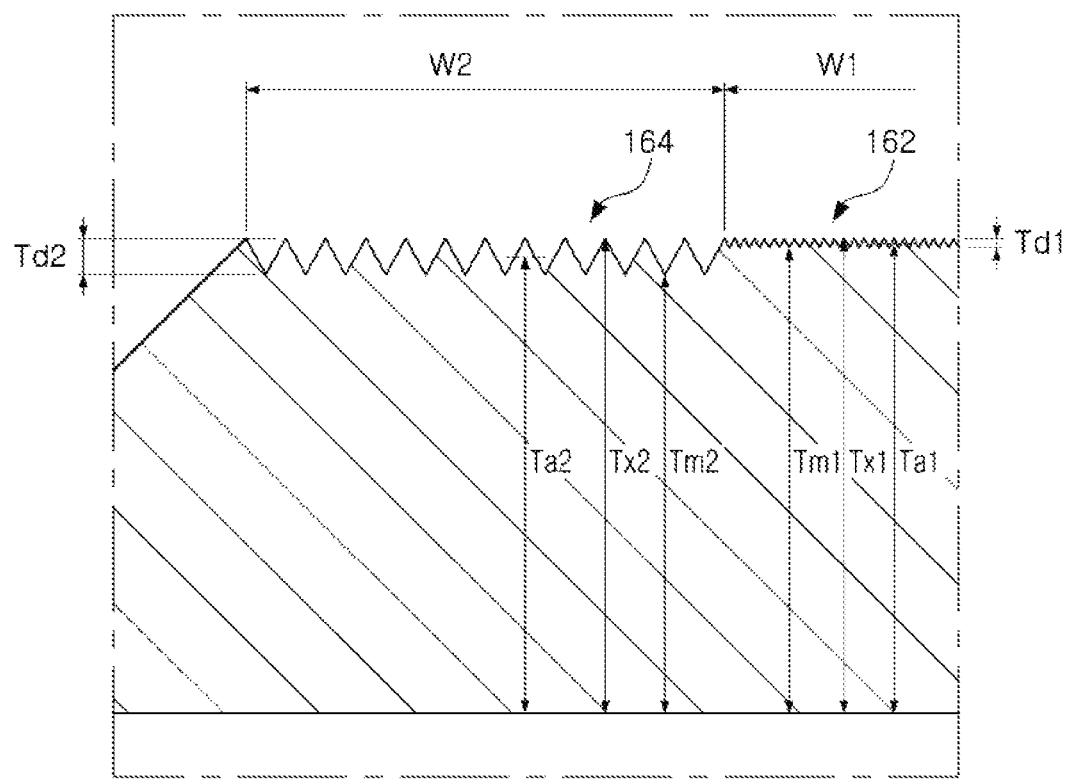
FIG. 3 is an enlarged view of a part A illustrated in FIG. 2.

Referring to FIGS. 2 and 3, the piezoelectric layer 160 includes a first piezoelectric portion 162 and a second piezoelectric portion 164. The first piezoelectric portion 162 is disposed at a central portion of the piezoelectric layer 160 and over a the central portion of the cavity 130, and the second piezoelectric portion 164 is disposed adjacent to an edge of the first piezoelectric portion 162 and over an edge portion of the cavity 130. That is, the first piezoelectric portion 162 is generally aligned with the central portion of the cavity 130 in the vertical direction, and the second piezoelectric portion 164 is generally aligned with an edge portion of the cavity 130 in the vertical direction. The second piezoelectric portion 164 may be disposed in a bisymmetrical form about the first piezoelectric portion 162. The first piezoelectric portion 162 disposed as described above activates a vibration in thickness direction (a vertical direction) of the piezoelectric layer 160, and the second piezoelectric portion 164 suppresses a vibration in length direction (a horizontal direction) of the piezoelectric layer 160.

As illustrated in FIG. 3, the first piezoelectric portion 162 and the second piezoelectric portion 164 have different thicknesses. For example, an average thickness Ta1 of the first piezoelectric portion 162 is different from an average thickness Ta2 of the second piezoelectric portion 164. For example the average thickness Ta1 of the first piezoelectric portion 162 is greater than the average thickness Ta2 of the second piezoelectric portion 164. An average thickness difference between the first piezoelectric portion 162 and the second piezoelectric portion 164 may be generated by a selective etching process.

The first piezoelectric portion 162 and the second piezoelectric portion 164 may have different surface roughnesses. For example, a maximum thickness deviation Td1 of the first piezoelectric portion 162 is different from a maximum thickness deviation Td2 of the second piezoelectric portion 164. Additionally, a surface (e.g., the top surface) of the second piezoelectric portion 164 may be rougher than a surface (e.g., the top surface) of the first piezoelectric portion 162. A difference between the roughness of the surface of the first piezoelectric portion 162 and the roughness of the surface of the second piezoelectric portion 164 may be generated by a selective etching process.

For example, the surface of the first piezoelectric portion 162 has a first roughness resulting from adjacent low points and high points thereof, and the second piezoelectric portion 164 has a second surface roughness provided by adjacent low point and high points thereof. The maximum thickness deviation Td1 may correspond to a maximum distance, in the thickness direction, from a low point of the first piezoelectric portion 162 to a high point of the first piezoelectric portion 162. The maximum thickness deviation Td2 may correspond to a maximum distance, in the thickness direction, from a low point of the second piezoelectric portion 162 to a high point of the second piezoelectric portion 164.

The first piezoelectric portion 162 and the second piezoelectric portion 164 may have a predetermined size relationship. For example, a maximum thickness Tx1 of the first piezoelectric portion 162 is substantially the same as a maximum thickness Tx2 of the second piezoelectric portion 164, but a minimum thickness Tm1 of the first piezoelectric portion 162 is greater than a minimum thickness Tm2 of the second piezoelectric portion 164.

The first piezoelectric portion 162 may be formed to be wider than the second piezoelectric portion 164. For example, a width W1 of the first piezoelectric portion 162 is greater than a width W2 of the second piezoelectric portion 164.

The width W2 of the second piezoelectric portion 164 may have a predetermined relationship with the thickness of the second piezoelectric portion 164. In an example, a ratio W2/Td2 of the maximum thickness deviation Td2 of the second piezoelectric portion 164 to the width W2 of the second piezoelectric portion 164 is selected in the range of 6 to 10.

The width W2 of the second piezoelectric portion 164 may be generally selected in the range of 0.3 to 50 μm, and the maximum thickness deviation Td2 of the second piezoelectric portion 164 may be generally selected in the range of 5 to 500 μm. However, the width W2 and the maximum thickness deviation Td2 of the second piezoelectric portion 164 are not limited to the above-mentioned sizes. For example, the width W2 and the maximum thickness deviation Td2 of the second piezoelectric portion 164 may be changed depending on a size and type of the acoustic wave resonator 100.

Since the first piezoelectric portion 162 and the second piezoelectric portion 164 have different physical characteristics, as described above, a horizontal vibration or a planar resonance wave caused by the first piezoelectric portion 162 may be scattered and attenuated. Therefore, the acoustic wave resonator 100 may effectively reduce noise caused by the horizontal vibration.

Next, an acoustic wave resonator 102 according to another embodiment in the present disclosure will be described below with reference to FIGS. 4 through 6. For reference, in the following description, the same components as those of the embodiment of FIGS. 1 through 3 above will be indicated by the same reference numerals, and a description of the same components will be omitted.

Figure 4:
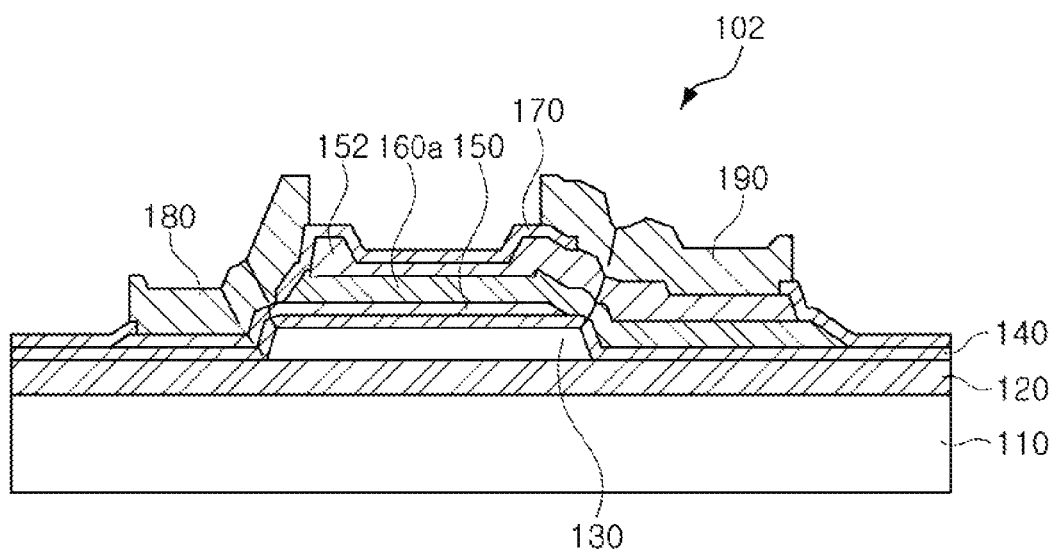
FIG. 4 is a cross-sectional view of an acoustic wave resonator, according to another embodiment.
Figure 5:
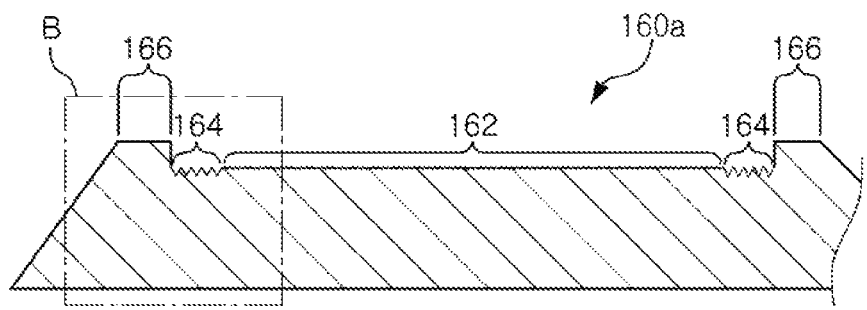
FIG. 5 is an enlarged view of a piezoelectric layer illustrated in FIG. 4.
Figure 6:
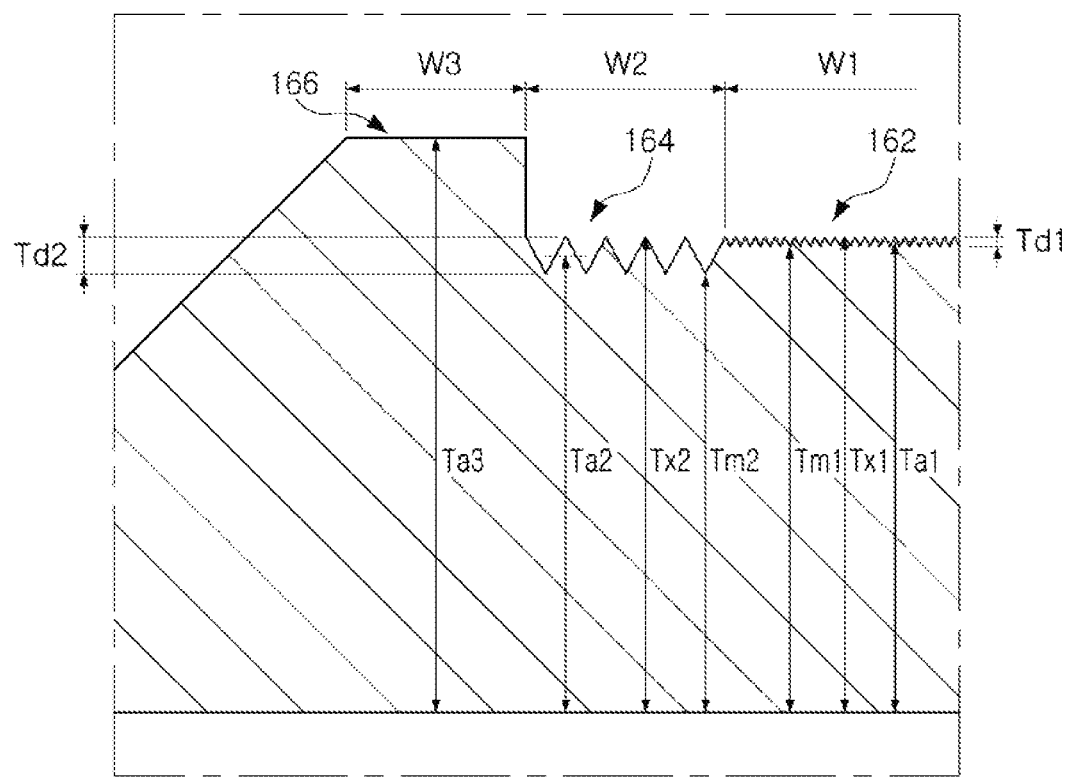
FIG. 6 is an enlarged view of a part B shown in FIG. 5.

Referring to FIGS. 4 through 6, the acoustic wave resonator 102 differs from the acoustic wave resonator 100 described above in that the acoustic wave resonator 102 includes a piezoelectric layer 160a that includes a third piezoelectric portion 166. For example, the piezoelectric layer 160a includes the first piezoelectric portion 162, the second piezoelectric portion 164, and the third piezoelectric portion 166.

The first piezoelectric portion 162 is disposed at the central portion of the piezoelectric layer 160a. The second piezoelectric portion 164 is disposed adjacent to an edge of the first piezoelectric portion 162, and the third piezoelectric portion 166 may be disposed adjacent to an edge of the second piezoelectric portion 164. That is, the second piezoelectric portion 164 and the third piezoelectric portion 166 may be disposed in a bisymmetrical form about the first piezoelectric portion 162.

The third piezoelectric portion 166 may have a thickness that is greater than a thickness of the first piezoelectric portion 162 and a thickness of the second piezoelectric portion 164. For example, an average thickness Ta3 of the third piezoelectric portion 166 may be greater than an average thickness Ta1 of the first piezoelectric portion 162 and an average thickness Ta2 of the second piezoelectric portion 164.

The third piezoelectric portion 166 may have substantially the same width as that of the second piezoelectric portion 164. For example, a width W3 of the third piezoelectric portion 166 is the same as a width W2 of the second piezoelectric portion 164.

The width W2 of the second piezoelectric portion 164 may have a predetermined relationship with the thickness of the second piezoelectric portion 164. In an example, a ratio W2/Td2 of the maximum thickness deviation Td2 of the second piezoelectric portion 164 to the width W2 of the second piezoelectric portion 164 is selected in the range of 6 to 10.

The width W2 of the second piezoelectric portion 164 may be generally selected in the range of 0.3 to 50 µm, and the maximum thickness deviation Td2 of the second piezoelectric portion 164 may be generally selected in the range of 5 to 500 µm. However, the width W2 and the maximum thickness deviation Td2 of the second piezoelectric portion 164 are not limited to the above-mentioned sizes. For example, the width W2 and the maximum thickness deviation Td2 of the second piezoelectric portion 164 may be changed depending on a size and kind of the acoustic wave resonator 100.

A width W3 of the third piezoelectric portion 166 may have a predetermined relationship with the width W2 of the second piezoelectric portion 164. For example, a ratio W2/W3 of the width W3 of the third piezoelectric portion 166 to the width W2 of the second piezoelectric portion 164 may be selected in the range of 0.8 to 1.2. In an example, the width W3 of the third piezoelectric portion 166 may be selected in the range of 0.3 to 50 µm.

The third piezoelectric portion 166 configured as described above may, together with the second piezoelectric portion 164, scatter and attenuate the horizontal vibration or the planar resonance wave caused by the first piezoelectric portion 162.

An acoustic wave resonator 104 according to another embodiment will be described below with reference to FIGS. 7 through 9.

Figure 7:
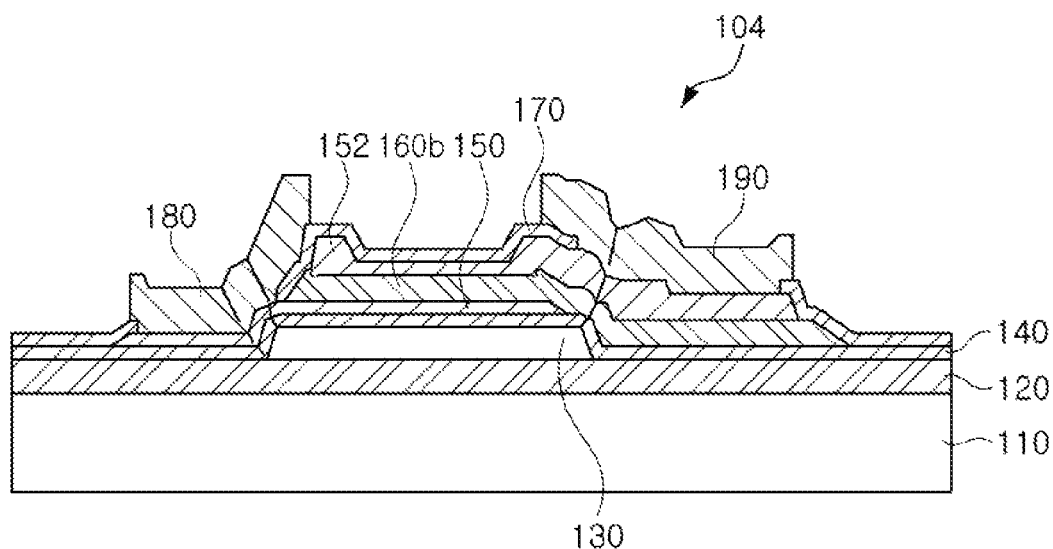
FIG. 7 is a cross-sectional view of an acoustic wave resonator, according to another embodiment.
Figure 8:
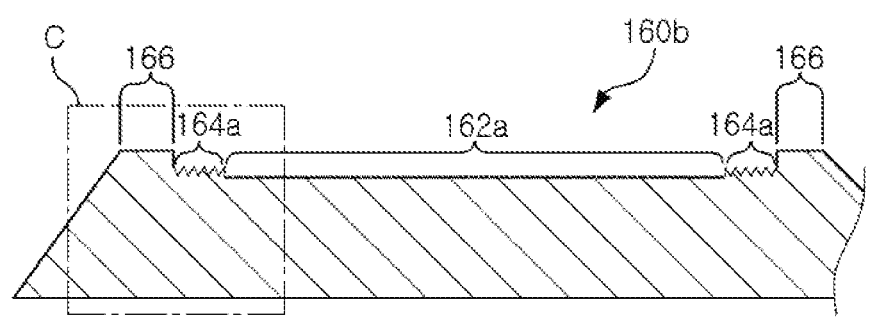
FIG. 8 is an enlarged view of a piezoelectric layer illustrated in FIG. 7.
Figure 9:
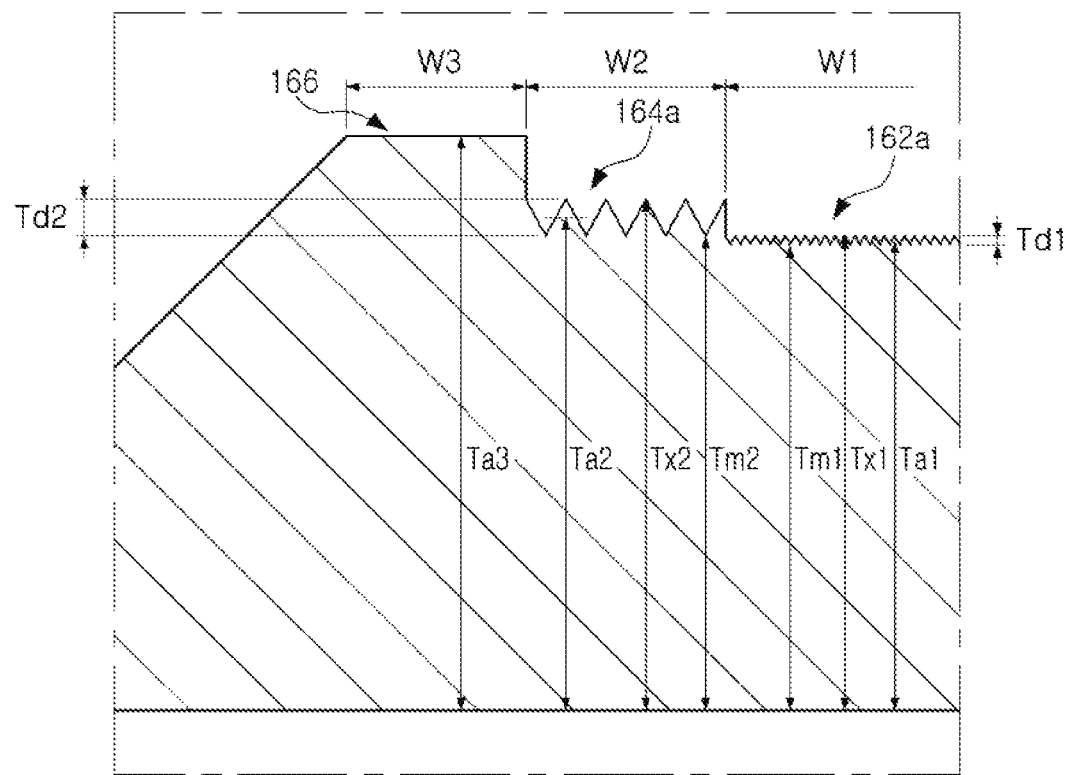
FIG. 9 is an enlarged view of a part C illustrated in FIG. 8.

Referring to FIGS. 7 through 9, the acoustic wave resonator 104 differs from the acoustic wave resonator 104 of the previous embodiment with respect to a size relationship between a first piezoelectric portion 162a and a second piezoelectric portion 164a.

Referring to FIGS. 7 through 9, the acoustic wave resonator 104 includes a piezoelectric layer 160b including the first piezoelectric portion 162a, the second piezoelectric portion 164a, and the third piezoelectric portion 166. The second piezoelectric portion 164a may be thicker than the first piezoelectric portion 162a. For example, a minimum thickness Tm2 of the second piezoelectric portion 164a may be greater than a minimum thickness Tm1 of the first piezoelectric portion 162a, and a maximum thickness Tx2 of the second piezoelectric portion 164a may be greater than a maximum thickness Tx1 of the first piezoelectric portion 162a. Further, an average thickness Ta2 of the second piezoelectric portion 164a may be greater than an average thickness Ta1 of the first piezoelectric portion 162a, and a maximum thickness deviation Td2 of the second piezoelectric portion 164a may be greater than a maximum thickness deviation Td1 of the first piezoelectric portion 162a.

An acoustic wave resonator 106 according to another embodiment will be described below with reference to FIGS. 10 through 12.

Figure 10:
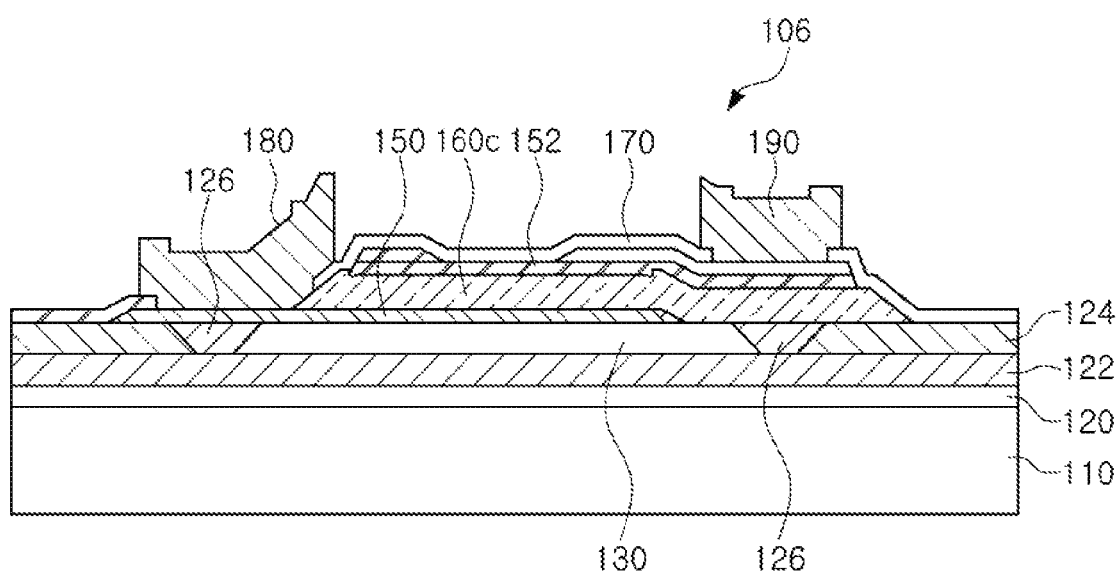
FIG. 10 is a cross-sectional view of an acoustic wave resonator, according to another embodiment.
Figure 11:
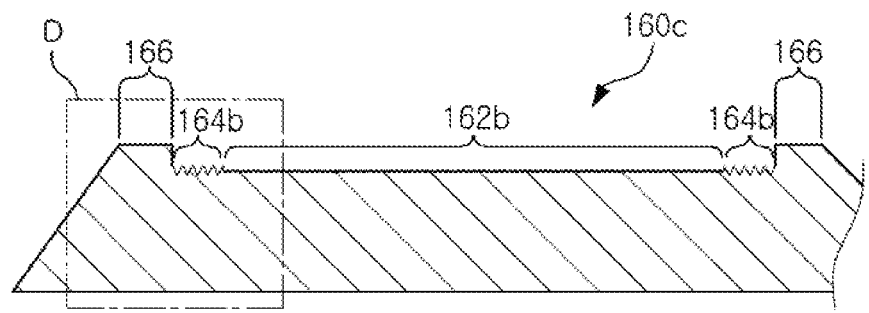
FIG. 11 is an enlarged view of a piezoelectric layer illustrated in FIG. 10.
Figure 12:
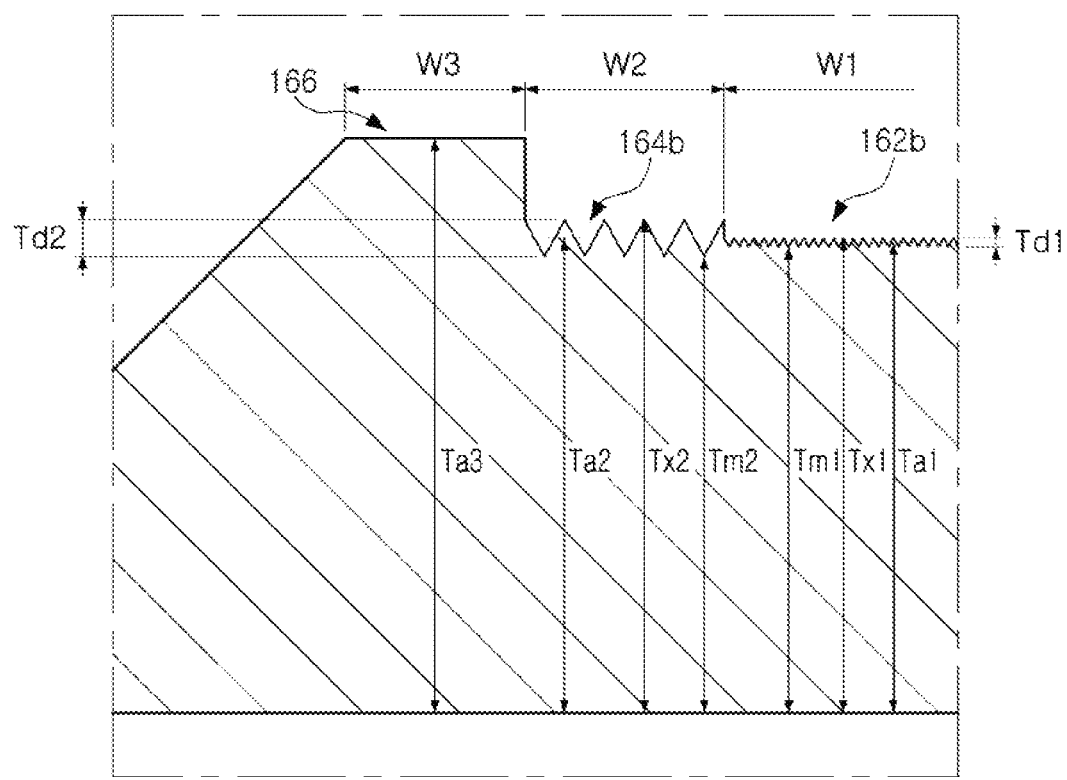
FIG. 12 is an enlarged view of a part D illustrated in FIG. 11.

Referring to FIGS. 10 through 12, the acoustic wave resonator 106 differs from the acoustic wave resonators 102 and 104 of the previous embodiments with respect to a size relationship between a first piezoelectric portion 162b and a second piezoelectric portion 164b.

Referring to FIGS. 10 through 12, the acoustic wave resonator 104 includes a piezoelectric layer 160c including the first piezoelectric portion 162b, the second piezoelectric portion 164b, and the third piezoelectric portion 166. For example, the second piezoelectric portion 164b may be thicker than the first piezoelectric portion 162b. For example, a maximum thickness Tx2 of the second piezoelectric portion 164b may be greater than a maximum thickness Tx1 of the first piezoelectric portion 162b. Further, a maximum thickness deviation Td2 of the second piezoelectric portion 164b may be greater than a maximum thickness deviation Td1 of the first piezoelectric portion 162b. However, a minimum thickness Tm2 of the second piezoelectric portion 164b may be less than a minimum thickness Tm1 of the first piezoelectric portion 162b. In addition, an average thickness Ta2 of the second piezoelectric portion 164b may be less than an average thickness Ta1 of the first piezoelectric portion 162b.

The acoustic wave resonator 106 also differs from the previous embodiments described above based on configurations of an etching stop layer 122 and an etching stop portion 126.

For example, the etching stop layer 122 is formed on the insulating layer 120. The etching stop layer 122 may serve to protect the substrate 110 and the insulating layer 120 in an etching process. An etching stop portion 126, the cavity 130, and a sacrificial layer pattern 124 are formed on the etching stop layer 122. The etching stop portion 126, the cavity 130, and the sacrificial layer pattern 124 may be formed at substantially the same height. Therefore, the acoustic wave resonator 106 may be made thinner than the acoustic wave resonators 100, 102 and 104, and may eliminate a manufacturing step.

The cavity 130 is disposed below the first electrode layer 150 so that the resonating part including the first electrode layer 150, the piezoelectric layer 160, and the second electrode layer 152 may be vibrated in a predetermined direction. The cavity 130 may be formed by an etching process of forming a sacrificial layer on the etching stop layer 122, stacking the first electrode layer 150, the piezoelectric layer 160, and the second electrode layer 152 sequentially on the sacrificial layer, and then etching and removing the sacrificial layer.

The etching stop portion 126 is formed at the outside of the cavity 130. The etching stop portion 126 is formed in a protrusion shape on the etching stop layer 122. An outer circumferential boundary surface of the cavity may be defined by the etching stop portion 126. The etching stop portion 126 may have a trapezoidal-shape cross-section that is substantially inverted in a vertical direction. The etching stop layer 122 and the etching stop portion 126 may be formed of a material that is not etched by the etching process. The etching stop layer 122 and the etching stop portion 126 may be formed of the same material. The shape of the cavity 130 after removal of the sacrificial layer may be defined by a space surrounded by the etching stop layer 122 and the etching stop portion 126. Additionally, a lower boundary surface of the cavity 130 is defined by the etching stop layer 122, and the outer circumferential boundary surface of the cavity 130 is defined by the etching stop portion 126.

The sacrificial layer pattern may be formed outside the etching stop portion 126. The sacrificial layer pattern 124 may be formed to extend to the outside of the etching stop portion 126. The sacrificial layer pattern 124 is a portion of the sacrificial layer that remains on the etching stop layer 122 after the etching process.

Figure 13:
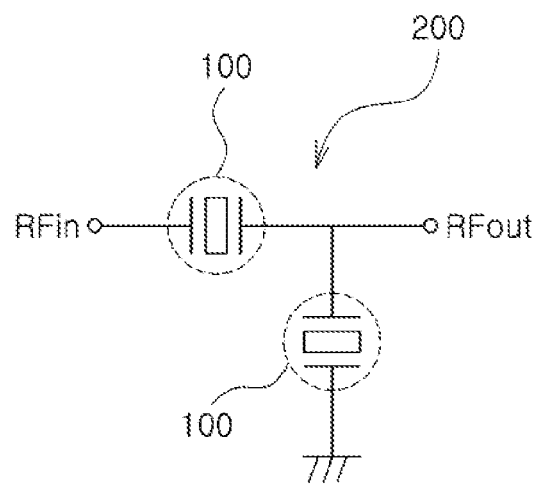
FIG. 13 is a block diagram of a filter, according to an embodiment.

Referring to FIG. 13, a filter 200, according to an embodiment has a ladder-type filter structure. For example, the filter 200 includes a plurality of acoustic wave resonators 100. In the filter 200, one acoustic wave resonator 100 is connected in series between a signal input terminal to which an input signal RFin is input and a signal output terminal from which an output signal RFout is output, and another acoustic wave resonator 100 is connected between the signal output terminal and a ground.

As set forth above, according to the embodiments disclosed herein, the noise caused by the horizontal resonance occurring at the edge of an acoustic wave resonator may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave resonator, comprising:
a first piezoelectric portion of a piezoelectric layer, disposed on a cavity and comprising a first surface roughness; and
a second piezoelectric portion of the piezoelectric layer, disposed adjacent to an edge of the first piezoelectric portion and comprising a second surface roughness that is different from the first surface roughness.

2. The acoustic wave resonator of claim 1, wherein
the first piezoelectric portion comprises a first average thickness, and
the second piezoelectric portion comprises a second average thickness that is different from the first average thickness.

3. The acoustic wave resonator of claim 1, wherein a minimum thickness of the first piezoelectric portion is greater than a minimum thickness of the second piezoelectric portion.

4. The acoustic wave resonator of claim 1, wherein a minimum thickness of the first piezoelectric portion is less than a minimum thickness of the second piezoelectric portion.

5. The acoustic wave resonator of claim 1, wherein a maximum thickness of the first piezoelectric portion is less than a maximum thickness of the second piezoelectric portion.

6. The acoustic wave resonator of claim 1, wherein a maximum thickness deviation of the second piezoelectric portion is smaller than a width of the second piezoelectric portion.

7. The acoustic wave resonator of claim 1, further comprising: electrode layers formed above and below the first piezoelectric portion and the second piezoelectric portion.

8. The acoustic wave resonator of claim 1, further comprising: a third piezoelectric portion disposed at an edge of the second piezoelectric portion.

9. The acoustic wave resonator of claim 8, wherein a width of the third piezoelectric portion is equal to or less than a width of the second piezoelectric portion.

10. The acoustic wave resonator of claim 8, wherein the third piezoelectric portion comprises an average thickness that is greater than an average thickness of the first piezoelectric portion and an average thickness of the second piezoelectric portion.

11. A filter comprising the acoustic wave resonator of claim 1.

12. An acoustic wave resonator, comprising:
a first piezoelectric portion of a piezoelectric layer, comprising a first maximum thickness deviation; and
a second piezoelectric portion of the piezoelectric layer, disposed at an edge of the first piezoelectric portion and comprising a second maximum thickness deviation that is different than the first maximum thickness deviation.

13. The acoustic wave resonator of claim 12, wherein the second maximum thickness deviation is greater than the first maximum thickness deviation.

14. The acoustic wave resonator of claim 12, wherein an average thickness of the first piezoelectric portion is different from an average thickness of the second piezoelectric portion.

15. The acoustic wave resonator of claim 12, wherein a maximum thickness of the first piezoelectric portion is less than or equal to a maximum thickness of the second piezoelectric portion.

16. The acoustic wave resonator of claim 12, further comprising:
a first electrode layer disposed on a first surface of the first piezoelectric portion; and
a second electrode layer disposed on a second surface of the first piezoelectric portion.

17. The acoustic wave resonator of claim 12, further comprising a cavity disposed between the first piezoelectric portion and a substrate.

18. The acoustic wave resonator of claim 12, wherein
the first maximum thickness deviation is formed by a roughness of a surface of the first piezoelectric portion, and
the second maximum thickness deviation is formed by a roughness of a surface of the second piezoelectric portion.

19. The acoustic wave resonator of claim 12, wherein a ratio of the second maximum thickness deviation to a width of the second piezoelectric portion is in a range of 6 to 10.

20. The acoustic wave resonator of claim 2, wherein the first average thickness is greater than the second average thickness.

* * * * *